United States Patent
Ning et al.

(10) Patent No.: US 8,907,496 B1
(45) Date of Patent: Dec. 9, 2014

(54) CIRCUIT STRUCTURES AND METHODS OF FABRICATION WITH ENHANCED CONTACT VIA ELECTRICAL CONNECTION

(71) Applicant: GLOBALFOUNDRIES Inc., Grand Cayman (KY)

(72) Inventors: GuoXiang Ning, Clifton Park, NY (US); Xiang Hu, Clifton Park, NY (US); Sarasvathi Thangaraju, Malta, NY (US); Paul Ackmann, Gansevoort, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/909,301

(22) Filed: Jun. 4, 2013

(51) Int. Cl.
*H01L 21/768* (2006.01)
*H01L 23/522* (2006.01)

(52) U.S. Cl.
CPC .... *H01L 21/76802* (2013.01); *H01L 21/76879* (2013.01); *H01L 23/5226* (2013.01)
USPC ........... 257/774; 257/621; 257/773; 257/775; 438/620; 438/622; 438/667; 438/668; 438/672; 438/675

(58) Field of Classification Search
CPC ............ H01L 21/768; H01L 21/76802; H01L 23/522; H01L 23/528; H01L 23/5384
USPC .......... 257/621, 773, 774, 775; 438/612, 620, 438/622, 668, 672, 675
See application file for complete search history.

(56) References Cited

U.S. PATENT DOCUMENTS

| | | | |
|---|---|---|---|
| 6,255,586 B1 * | 7/2001 | Kim et al. | 174/538 |
| 2010/0038790 A1 * | 2/2010 | Bonilla et al. | 257/758 |
| 2010/0270670 A1 * | 10/2010 | Yeo et al. | 257/700 |

* cited by examiner

*Primary Examiner* — Peniel M Gumedzoe
(74) *Attorney, Agent, or Firm* — Kevin P. Radigan, Esq.; Heslin Rothenberg Farley & Mesiti P.C.

(57) ABSTRACT

Circuit structures and methods of fabrication are provided with enhanced electrical connection between, for instance, a first metal level and a contact surface of a conductive structure. Enhanced electrical connection is achieved using a plurality of contact vias which are differently-sized, and disposed over and electrically coupled to the contact surface. The differently-sized contact vias include at least one center region contact via disposed over a center region of the contact surface, and at least one peripheral region contact via disposed over a peripheral region of the contact surface, where the at least one center region contact via is larger than the at least one peripheral region contact via.

20 Claims, 5 Drawing Sheets

CIRCUIT STRUCTURES AND METHODS OF FABRICATION WITH ENHANCED CONTACT VIA ELECTRICAL CONNECTION

BACKGROUND

In circuit structure manufacturing, such as semiconductor device manufacturing, three-dimensional (3-D) integration can be achieved, for instance, using through substrate vias (TSVs) for chip stacking. Connecting or contact vias between the first metal level (or layer) and the TSVs is one useful method for achieving such integration, especially for 20 nm technology and below. Conventionally, there is a desire to achieve minimum pitch and minimum critical dimension (CD) for these contact vias to achieve as many connections as possible between the conductive structure (e.g., TSV) and first metal layer. Current practice for forming tightly packed connecting vias uses two reticles in a double-pattern process, in order to achieve the desired points of connectivity between the metal and TSV layers. In one application, the contacting vias are substantially identical and arrayed roughly uniformly over the contact surface of the TSV. In such an implementation, a "via opening" issue may arise depending, in part, on the circuit fabrication process flow.

BRIEF SUMMARY

The shortcomings of the prior art are overcome and additional advantages are provided through the provision, in one aspect, of a circuit structure which includes a conductive structure and a plurality of contact vias. The circuit structure includes a contact surface, and the plurality of contact vias are smaller than, and disposed over, the conductive structure and electrically contact the contact surface of the conductive structure. The plurality of contact vias include at least some differently-sized contact vias with at least one center region contact via being disposed over a center region of the contact surface, and at least one peripheral region contact via being disposed over a peripheral region of the contact surface of the conductive structure. In this configuration, the at least one center region contact via is larger than the at least one peripheral region contact via.

In another aspect, a method is provided which includes: facilitating forming a circuit structure, the facilitating forming including: providing a conductive structure having a contact surface; and forming a plurality of contact vias over the contact surface of the conductive structure, the plurality of contact vias being smaller than the conductive structure and electrically contacting the contact surface of the conductive structure, and the plurality of contact vias including at least some differently-sized contact vias, with at least one center region contact via being disposed over a center region of the contact surface, and at least one peripheral region contact via being disposed over a peripheral region of the contact surface of the conductive structure, the at least one center region contact via being larger than the at least one peripheral region contact via.

Additional features and advantages are realized through the techniques of the present invention. Other embodiments and aspects of the invention are also described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note also that reference is made below to the drawings, which are not drawn to scale for ease of understanding, wherein the same reference number used throughout different figures designates the same or similar components.

As noted, in integrated circuit or semiconductor device manufacturing, three-dimensional (3-D) integration is being explored using, for instance, through substrate vias (TSVs) for stacking of chips into a three-dimensional package. A through substrate via is one example of a relatively large conductive structure having a contact surface at an upper or lower surface. By way of specific example, the conductive structure discussed herein is a relatively large structure, for instance, having a diameter in the range of 1 µm to 10 µm. With such a relatively large conductive structure, chemical-mechanical polishing of the circuit structure with the contact surface exposed can result in dishing or concaving of the contact surface from a peripheral region to a center region thereof. As a specific example, this dishing might be in the range of 10 to 50 nanometers, and could result in degraded electrical connection to the conductive structure, as explained further below.

Figure 1:
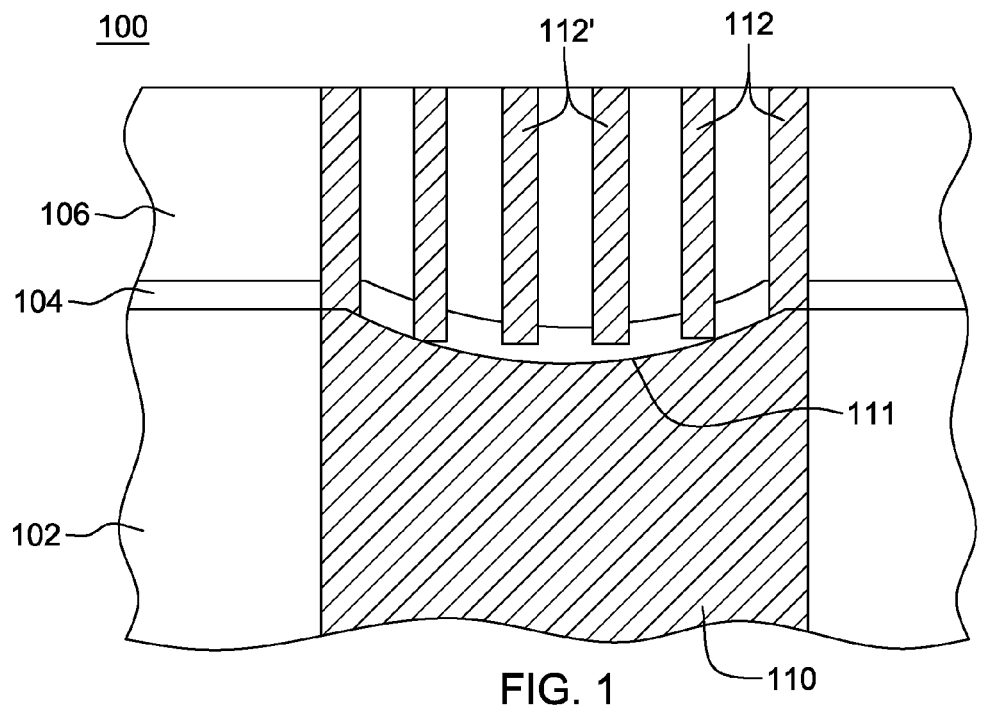
FIG. 1 is a partial cross-sectional elevational view of one embodiment of a circuit structure which includes a conductive structure and a plurality of contact vias arrayed over the conductive structure, and illustrating an open via problem to be addressed, in accordance with one or more aspects of the present invention.

In FIG. 1, a cross-sectional elevational depiction of a circuit structure 100 is provided which includes a substrate 102 fabricated of one or more layers of material, such as one or more layers of a semiconductor or dielectric material(s). For instance, in one example, substrate 102 may include an oxide. Circuit structure 100 further includes, by way of example only, a thin dielectric layer, such as a nitrogen-doped barrier, low-k dielectric layer, referred to herein as an NBlok layer 104, and an interlayer dielectric 106 disposed over NBlok layer 104. As illustrated in FIG. 1, a conductive structure 110 extends, at least in part, within, or through, substrate 102, and includes a contact surface 111 with dishing or concaving from a peripheral region (that is, an outer region) towards a center region (or center) of the conductive structure 110. In one specific example, conductive structure 110 is a through substrate via, and contact surface 111 is an upper or lower surface of the through substrate via. A plurality of contact vias 112 are illustrated extending, for example, between a first metal layer (not shown) and conductive structure 110 to facilitate electrical connection therebetween. As illustrated in FIG. 1, one or more contact vias 112' in the center region of conductive structure 110 may be open-circuited, terminating within (in this example) NBlok layer 104, and not make electrical contact to contact surface 111 of conductive structure 110, for instance, due to the concaving (or dishing) of the contact surface during previous processing.

In one implementation, the contact vias in a via farm design may be substantially uniform, closely spaced structures, referred to as dense vias. One approach to addressing the above-noted via open issue is to over-etch the via openings to ensure contact surface 111 in the center region of the conductive structure is exposed. However, over-etching of the via openings may result in etching of the conductive structure itself, which may cause deposition of metal-rich byproduct in the lower portion of certain ones of the via openings, or on the sidewalls thereof, which could also result in a via open issue in these vias. For instance, over-etching may occur in via openings over the peripheral region of the conductive structure since etching in those regions occurs longer than necessary to expose the underlying conductive structure. By way of example, if the conductive structure is a cooper through substrate via (TSV), deposition of copper-rich byproduct may occur in the lower portion of the via openings over the peripheral region of the through substrate via, or along the sidewalls of these via openings in the lower portion of the via, either of which could potentially close off the via opening in the bottom portion of the via and result in a via open issue subsequent to metallization of the via openings. This copper-rich byproduct may itself be non-conductive or poorly conductive when formed within the via opening.

Figure 2:
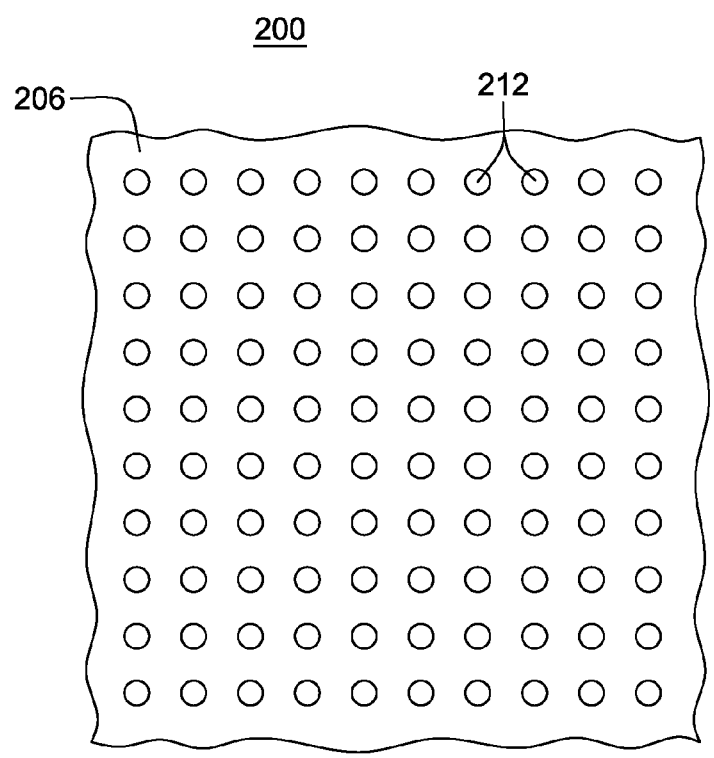
FIG. 2 is a plan view of one embodiment of a plurality of contact vias arrayed over a contact surface of a conductive structure and facilitating electrical connection between the underlying conductive structure and, for instance, a first metal (or metal-one) layer, in accordance with one or more aspects of the present invention.

FIG. 2 depicts a plan view of one embodiment of a circuit layout for electrically connecting between a first metal (or metal-one (M1)) level or layer and, for instance, an underlying through substrate via (TSV). In this circuit layout or via farm design 200, a plurality of contact vias 212 are arrayed within one or more dielectric layers 201 so as to extend from (or between) the first metal level to a contact surface of the underlying conductive structure or through substrate via. As noted, depending on the extent of dishing or concaving of the conductive structure's contact surface, one or more of the contact vias may fail to electrically couple to the conductive structure, due to a via open issue. Note that as used herein, "contact via" means a conductive via, such as a metalized via, and may be formed, for instance, to electrically connect one layer to another layer of an integrated circuit chip or package. Further, in one example, a through substrate via is one example of a conductive structure, and may be a metal structure, such as a copper structure, which is electrically contacted by multiple metal contact vias.

Generally stated, disclosed herein are circuit structures and methods of fabrication which address the above-described via open issues. The circuit structure includes, for instance, a conductive structure, such as a through substrate via, which has a contact surface to be electrically contacted. A plurality of contact vias smaller than the conductive structure are provided over and electrically contacting the contact surface of the conductive structure. The plurality of contact vias include at least some differently-sized contact vias, with at least one center region contact via disposed over a center region of the contact surface, and at least one peripheral region contact via disposed over a peripheral region of the contact surface, where the at least one peripheral region contact via is disposed over the conductive structure closer to a periphery of the conductive structure than the center region contact via, and the at least one center region contact via is larger than the at least one peripheral region contact via. For instance, the at least one central region contact via may have a larger diameter and a larger depth, than the diameter and depth, respectively, of at least one peripheral region contact via.

In one implementation, the plurality of contact vias are arrayed over the contact surface of the conductive structure, and the contact surface of the conductive structure is at least partially concave (or dished) in the center region thereof. By way of example, the contact structure may be a through substrate via extending within, at least in part, a substrate of the circuit structure, and the contact surface may be an upper surface or a lower surface of the through substrate via.

In one implementation, the plurality of contact vias may include multiple center region contact vias and multiple peripheral region contact vias. Still further, the plurality of contact vias may include multiple intermediate region contact vias disposed over an intermediate region of the contact surface of the conductive structure between the center region and the peripheral region of the contact surface of the conductive structure. These multiple intermediate region contact vias may have a smaller diameter and a smaller depth than the multiple center region contact vias, and a larger diameter and a larger depth than the multiple peripheral region contact vias. By way of further example, the plurality of contact vias may be arrayed within a first metal level trench of the circuit structure over the contact surface of the conductive structure.

For instance, in one embodiment, the first metal level trench may include multiple concentric trench rings of decreasing width from a center ring to a peripheral ring, and different concentric trench rings may each accommodate different ones of the multiple center region contact vias, the multiple intermediate region contact vias, and the multiple peripheral region contact vias. In one specific example, the multiple concentric trench rings may be rectangular-shaped trench rings or circular-shaped trench rings. Also, by way of example, the conductive structure and the plurality of contact vias may be formed of a common metal, such as copper.

Note that although characterized as including, in one or more examples, one or more center region contact vias, one or more intermediate region contact vias, and one or more peripheral region contact vias, these three groupings of contact vias are discussed and illustrated by way of example only. Any n number of contact via formations may be provided, with different ones of the contact vias being differently-sized to ensure, for example, good electrical connection to a contact surface, which may be (at least in part) dished or concaved due to, for instance, prior chemical-mechanical polishing of the surface. Note also that the particular diameter and depth of the contact vias may be ascertained by one skilled in the art from the description provided herein. For instance, these values may be empirically ascertained for a given circuit structure. That is, for a given circuit structure, one skilled in the art can readily configure the diameter and depth of the differently-sized contact vias over the different regions of the contact surface to achieve a desired via profile, wherein all via openings expose a portion of the contact surface without excessive over-etching of the contact surface.

Figure 3A:
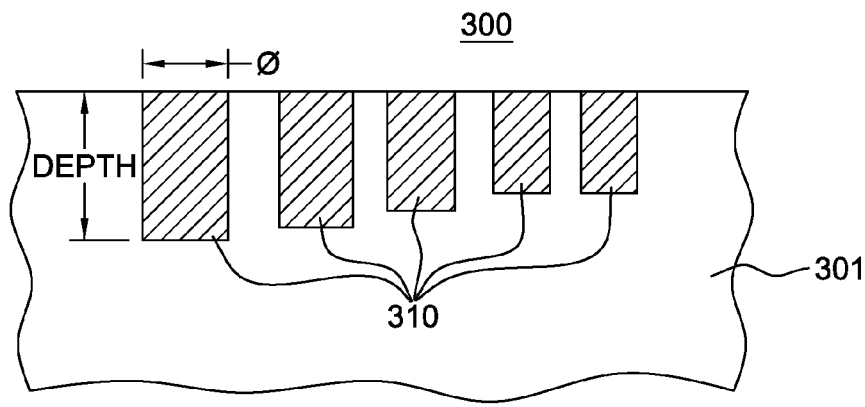
FIG. 3A is a cross-sectional elevational view of a circuit structure with different diameter and depth contact vias, decreasing in size from left-to-right, for instance, from over a center region of a contact surface of a conductive structure, to over a peripheral region of the contact surface, in accordance with one or more aspects of the present invention.
Figure 3B:
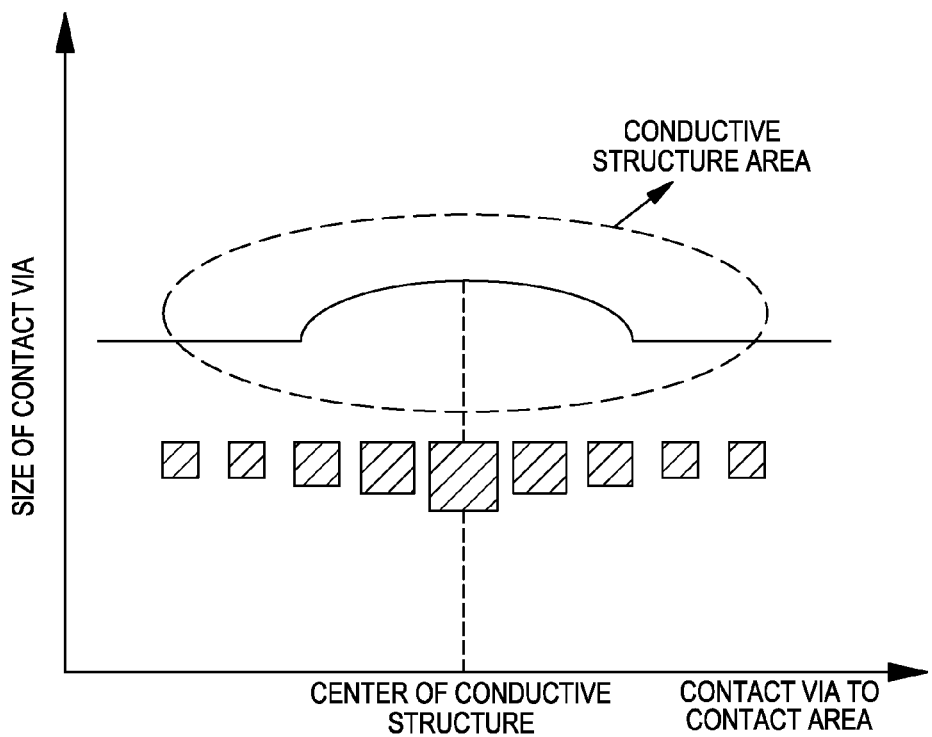
FIG. 3B is a graph illustrating decreasing diameter and depth of contact vias from over a center region of a conductive structure, outward towards a periphery of the conductive structure, in accordance with one or more aspects of the present invention.

FIG. 3A illustrates differently-sized contact vias 310 extending into a layer 301 of a circuit structure 300. As illustrated in FIG. 3A, the contact vias 310 decrease in size from left to right in terms of both a diameter ($\phi$) and a depth ("DEPTH"), where in order to achieve a greater via depth, a larger diameter via opening is used, resulting in the differently-sized contact vias depicted. In addition, as understood in the art, as the diameter of a via opening increases, the etch time required to etch that via opening decreases, meaning that the differently-sized contact vias 310 of FIG. 3A, with different depths, can be achieved within, for instance, the same etch time interval. In FIG. 3B, a graph of contact via size versus contact via to contact area is depicted, where the size of the contact via to area increases in the center region and/or intermediate region(s) over the contact surface. Note that the size and number of contact vias depicted in FIGS. 3A & 3B are provided by way of example only of the concepts disclosed herein.

Figure 4A:
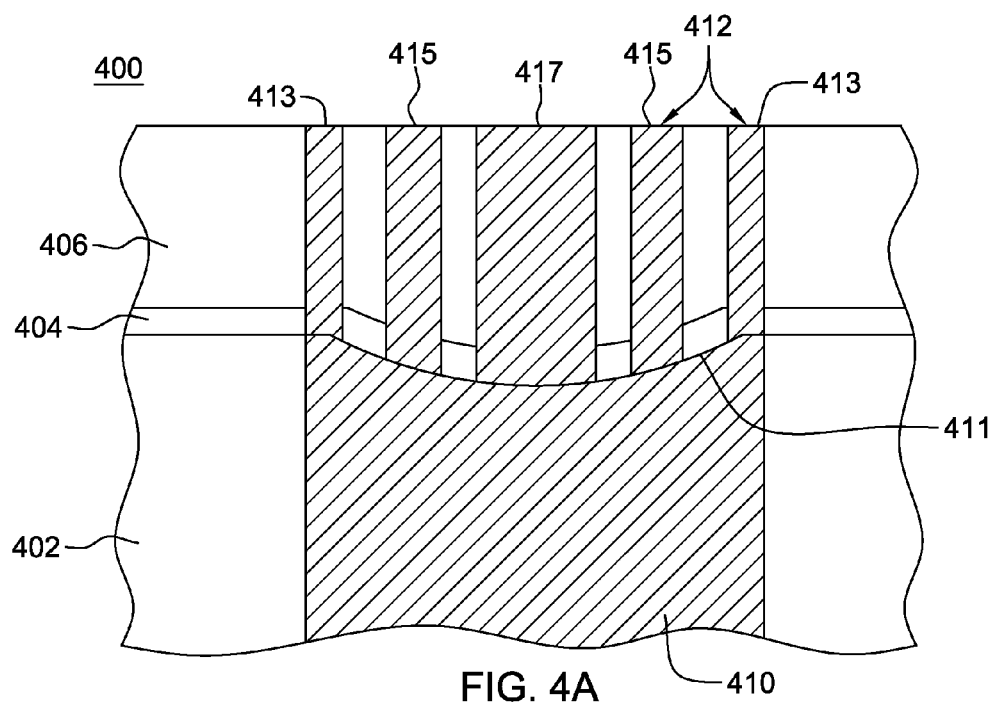
FIG. 4A is a partial cross-sectional elevational view of a circuit structure including a conductive structure and a plurality of contact vias arrayed over the conductive structure, in accordance with one or more aspects of the present invention.
Figure 4B:
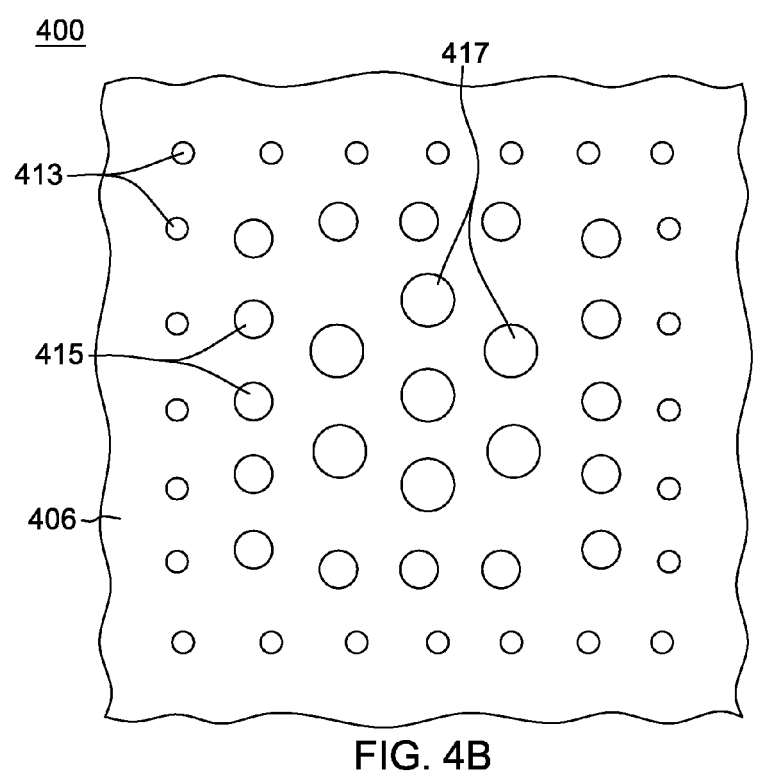
FIG. 4B is a partial plan view of one circuit layout of a plurality of contact vias over a conductive structure, in accordance with one or more aspects of the present invention.

By way of example, FIG. 4A depicts a partial cross-sectional elevational view of one embodiment of a circuit structure, generally denoted 400, in accordance with one or more aspects of the present invention. This circuit structure is similar to the circuit structure example of FIG. 1 in that a conductive structure 410 is provided extending into (or through) one or more layers, for instance, one or more layers of a substrate 402, over which a first dielectric layer, such as a nitrogen-doped barrier, low-k dielectric layer, or NBlok layer 404 is disposed, as well as a second dielectric layer 406, such as an interlayer dielectric layer. Conductive structure 410 includes a contact surface 411 which is at least partially dished or concaved, in this example, as a result of prior polishing of the surface.

As illustrated, a plurality of contact vias 412 are provided which are smaller than conductive structure 410 and which electrically contact the contact surface 411 of the conductive structure 410. The plurality of contact vias 412 include at least some differently-sized contact vias 413, 415, 417. In the example of FIG. 4A, the differently-sized contact vias include at least one center contact via 417, multiple intermediate region contact vias 415, and multiple peripheral region contact vias 413, respectively disposed over a center region, an intermediate region, and a peripheral region of the contact surface of the conductive structure 410 from, for instance, a center line of the conductive structure radially outward towards a periphery thereof.

As illustrated, the one or more central region contact vias 417 are larger in size than the multiple intermediate region contact vias 415 and the multiple peripheral region contact vias 413, and further, the multiple intermediate region contact vias 415 are larger in size than the multiple peripheral region contact vias 413. In this context, larger in size denotes a larger diameter, and a larger depth, as explained above. As discussed, the diameters and depths of the contact vias are chosen or tailored so that the via openings expose the contact surface 411 during fabrication processing within a small time window, thereby avoiding any over-etching of the contact surface, for example, in the peripheral region thereof, which would otherwise be employed to reach the dished center region of the contact surface.

Figure 5A:
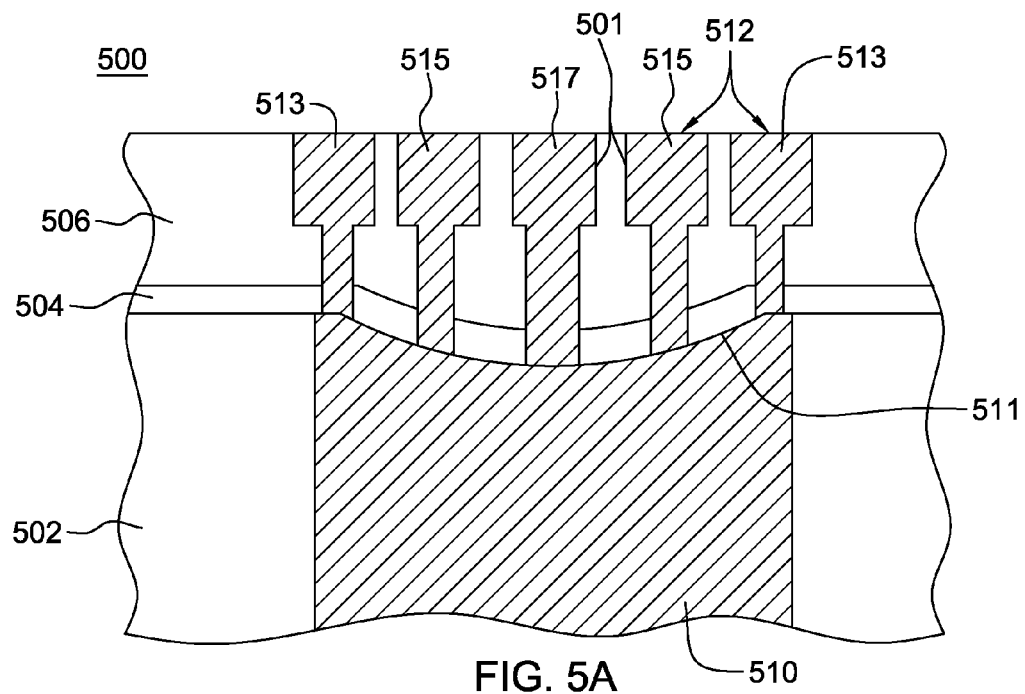
FIG. 5A is a partial cross-sectional elevational view of another circuit structure, including a conductive structure and a plurality of contact vias arrayed over the conductive structure, in accordance with one or more aspects of the present invention.

As a further example, FIG. 5A depicts a partial cross-sectional elevational view of another embodiment of a circuit structure 500, in accordance with one or more aspects of the present invention. This circuit structure is similar to the circuit structure example of FIG. 4A in that a conductive structure 510 is provided extending into (or through) one or more layers, for instance, one or more layers of a substrate 502, over which a first dielectric layer, such as a nitrogen-doped barrier, low-k dielectric layer, or NBlok layer 504 is disposed, as well as a second dielectric layer 506, such as an interlayer dielectric layer. Conductive structure 510 includes a contact surface 511 which is at least partially dished or concaved, in this example, as a result of prior polishing of the surface.

As illustrated, a plurality of contact vias 512 are provided, which are differently-sized, at least in part, similar to the contact vias 412 of the embodiment of FIG. 4A described above. In this example, however, it is assumed that one or more trenches 501 are provided within, for instance, second dielectric layer 506. In one example, trenches 501 may include multiple concentric trenches provided at a metal-one layer of the circuit structure, as described below in connection with FIGS. 5B-5D.

As illustrated in FIG. 5A, a plurality of contact vias 512 are provided, which are smaller than conductive structure 510, and which electrically contact surface 511 of conductive structure 510. The plurality of contact vias 512 reside partially within trenches 501 of uniform width, and include at least some differently-sized contact vias 513, 515, 517 contacting contact surface 511, as illustrated. In the example of FIG. 5A, the differently-sized contact vias include at least one center contact via 517, multiple intermediate region contact vias 515, and multiple peripheral region contact vias 513, respectively disposed over a center region, an intermediate region, and a peripheral region of the contact surface of the conductive structure 510 from, for instance a center line of the conductive structure radially outward towards a periphery thereof. In this example, it is assumed that the plurality of contact vias 512 extend downwards from a first metal layer trench, as described further below in connection with FIGS. 5B-5D.

As with the embodiment of FIG. 4A, the one or more central region contact vias 517 are larger in size than the multiple intermediate region contact vias 515 and the multiple peripheral region contact vias 513, and further, the multiple intermediate region contact vias 515 are larger in size than the multiple peripheral region contact vias 513. In this context, larger in size denotes a larger diameter, and a larger depth, as explained above. As discussed, the diameters and depths of the contact vias are chosen or tailored so that the via openings expose the contact surface 511 during fabrication processing within a small time window, thereby avoiding any over-etching of the contact surface, for example, in the peripheral region thereof, which would otherwise be employed to reach the dished center region of the contact surface.

Figure 5B:
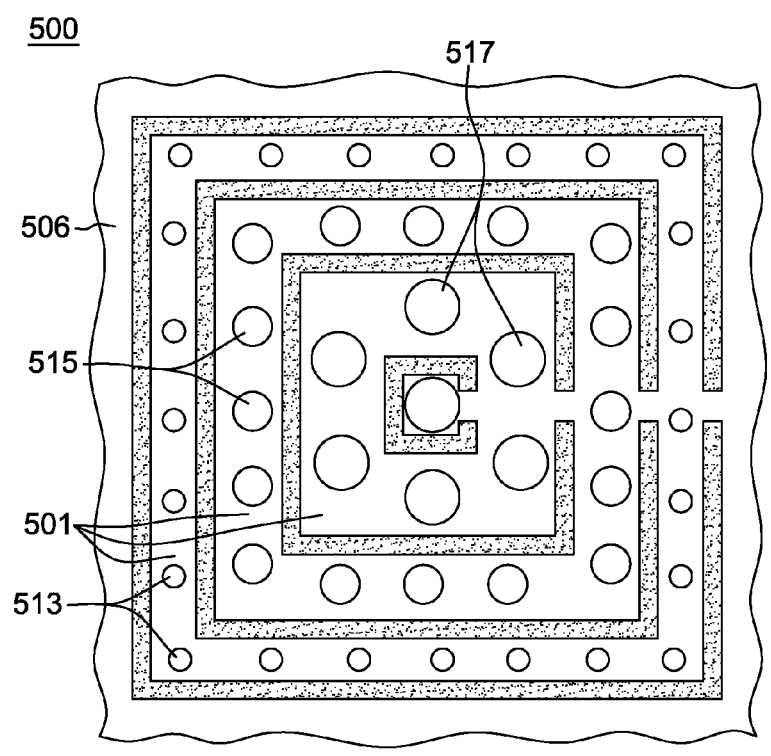
FIG. 5B is a partial plan view of one circuit layout of a plurality of contact vias over a conductive structure, in accordance with one or more aspects of the present invention.
Figure 5C:
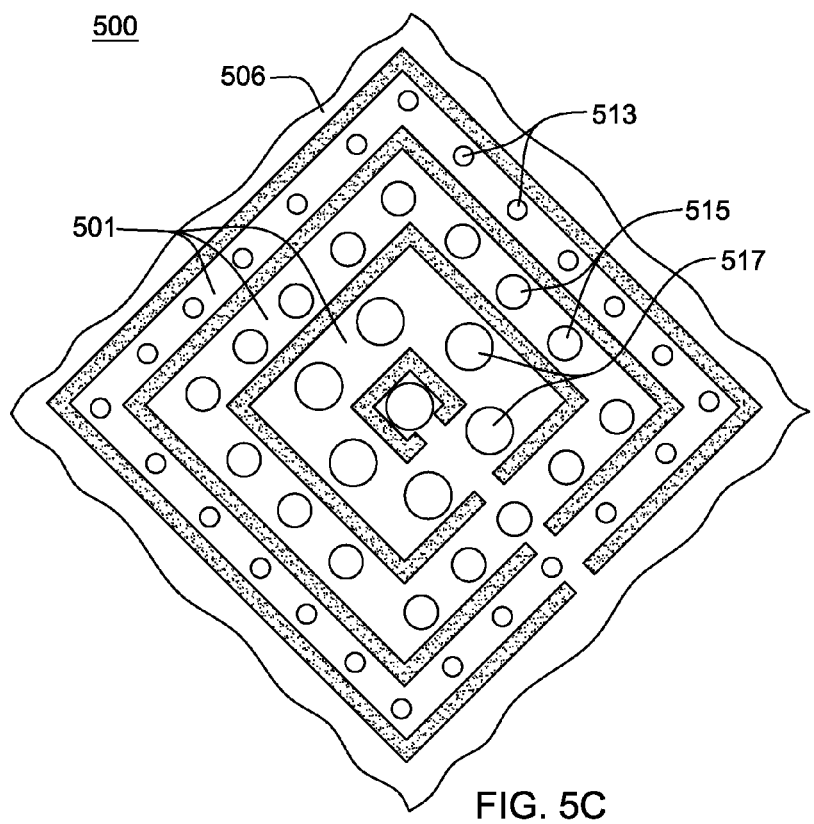
FIG. 5C is an alternate embodiment of a circuit layout of a plurality over contact vias of a conductive structure, in accordance with one or more aspects of the present invention.
Figure 5D:
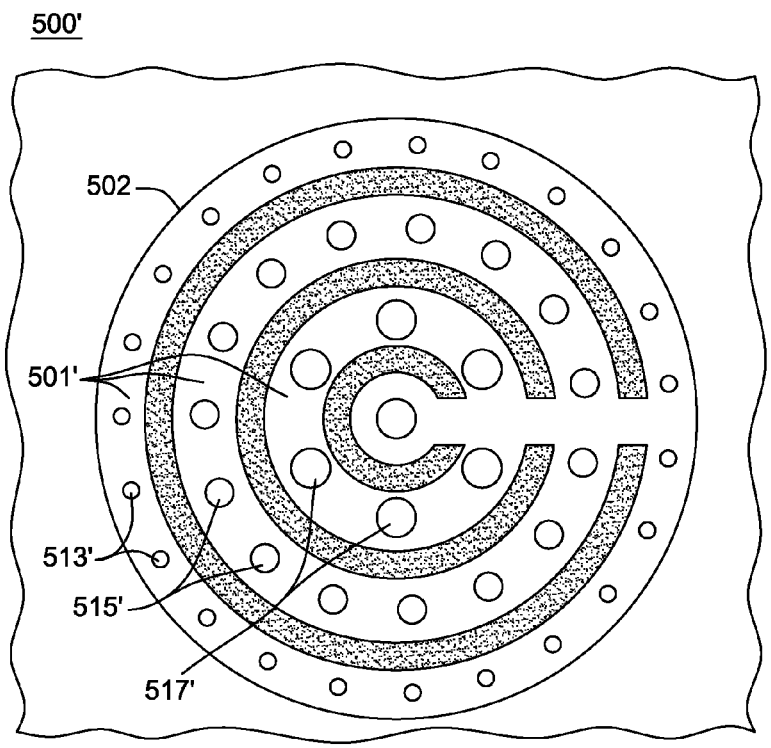
FIG. 5D is a plan view of another circuit layout of a plurality of contact vias over a conductive structure, in accordance with one or more aspects of the present invention.

FIGS. 5B-5D depict various layout examples of circuit structures comprising a plurality of contact vias arrayed over a conductive structure, such as a through substrate via, and facilitating electrical connection between the through substrate via and a first metal layer of the circuit structure.

For instance, and by way of example only, FIG. 5B depicts a partial plan view of a circuit structure 500 at a metal-one layer 505 of the circuit structure, wherein multiple concentric trenches 501 are formed within, for example, an interlayer dielectric of the circuit structure. In the example of FIG. 5A, the multiple concentric trench rings 501 decrease in size from a center trench ring outward to a peripheral trench ring. This is depicted in FIGS. 5B-5D by way of example only. In an alternate embodiment, the multiple concentric trench rings each have the same width from the center trench ring outward to the peripheral trench ring. Note also that the depicted example assumes that the conductive structure to be electrically contacted lies below the illustrated contact vias 513, 515, 517. In this example, the inner-most trench ring accommodates the largest contact vias 517 having the larger diameter and larger depth than the other contact vias, an intermediate trench ring accommodates the intermediate region contact vias 515, and a peripheral trench ring accommodates the peripheral region contact vias 513. Note again that this configuration or layout is provided by way of example only.

FIG. 5C depicts the partial circuit structure layout of FIG. 5B, with the orientation rotated, for instance, 45°. This orientation may be advantageous depending, for example, on the orientation of the underlying conductive structure.

In the example configuration of FIG. 5D, a circuit structure 500' is provided similar to that described above in connection with FIG. 5B, however, in this example, the first metal level trench 502 includes multiple concentric circular trench rings 501' of (for instance) decreasing width, from a center trench ring outward to a peripheral trench ring. As noted above, in an alternate configuration, the multiple concentric circular trench rings 501' may each have the same width from the center trench ring outward to the peripheral trench ring. As illustrated, multiple central region contact vias 517' are disposed within an inner-most trench ring of the layout, intermediate region contact vias 515' are disposed within an intermediate trench ring, and peripheral region contact vias 513' are arrayed within the peripheral trench ring depicted. Note that the square (or rectangular) and circular-shaped trench ring configurations of FIGS. 5B-5D are provided by way of example only. Size and configuration of the desired contact via layout may depend, at least in part, on the shape and size of the underlying conductive structure to which the first metal layer is to electrically connect.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A circuit structure comprising:
   a conductive structure comprising a concave contact surface, the concave contact surface being concave from a peripheral region inwards towards a center region thereof; and
   a plurality of contact vias smaller than the conductive structure and electrically contacting the concave contact surface of the conductive structure, the plurality of contact vias comprising at least some differently-sized contact vias, with at least one center region contact via being disposed over the center region of the concave contact surface and at least one peripheral region contact via being disposed over the peripheral region of the concave contact surface, the at least one center region contact via being larger than the at least one peripheral region contact via.

2. The circuit structure of claim 1, wherein the plurality of contact vias are arrayed over the concave contact surface of the conductive structure, and the at least one center region contact via is disposed only over the center region of the concave contact surface, and the at least one peripheral region contact via is disposed only over the peripheral region of the concave contact surface.

3. The circuit structure of claim 1, wherein the conductive structure comprises a through substrate via (TSV) extending within, at least in part, a substrate of the circuit structure, and the concave contact surface comprises one of an upper surface or a lower surface of the through substrate via.

4. The circuit structure of claim 1, wherein the at least one center region contact via is sized with a larger diameter and a larger depth than a diameter and a depth, respectively, of the at least one peripheral region contact via.

5. The circuit structure of claim 1, wherein the plurality of contact vias comprise multiple center region contact vias and multiple peripheral region contact vias, the multiple center region contact vias being sized with a larger diameter and a larger depth than the multiple peripheral region contact vias.

6. The circuit structure of claim 5, wherein the plurality of contact vias further comprise multiple intermediate region contact vias disposed over an intermediate region of the concave contact surface of the conductive structure between, at least in part, the center region and the peripheral region thereof, the multiple intermediate region contact vias being sized with a smaller diameter and a smaller depth than the multiple center region contact vias, and a larger diameter and a larger depth than the multiple peripheral region contact vias.

7. The circuit structure of claim 6, wherein the plurality of contact vias are arrayed in a first metal level trench of the circuit structure over the conductive structure.

8. The circuit structure of claim 7, wherein the first metal level trench comprises multiple concentric trench rings of decreasing width from a center trench ring to a peripheral trench ring.

9. The circuit structure of claim 8, wherein different trench rings of the multiple concentric trench rings each accommodate a different one of the multiple center region contact vias, the multiple intermediate region contact vias, and the multiple peripheral region contact vias.

10. The circuit structure of claim 8, wherein the multiple concentric trench rings are one of rectangular-shaped trench rings or circular-shaped trench rings.

11. A circuit structure comprising:
a conductive structure comprising a contact surface; and
a plurality of contact vias smaller than the conductive structure and electrically contacting the contact surface of the conductive structure, the plurality of contact vias comprising least some differently-sized contact vias, with at least one center region contact via being disposed over a center region of the contact surface and at least one peripheral region contact via being disposed over a peripheral region of the contact surface, the at least one center region contact via being larger than the at least one peripheral region contact via; and
wherein the plurality of contact vias further comprise at least one intermediate region contact via disposed over an intermediate region of the contact surface of the conductive structure between, at least in part, the center region and the peripheral region thereof, the at least one intermediate region contact via being sized with a smaller diameter and a smaller depth than the at least one center region contact via, and a larger diameter and a larger depth than the at least one peripheral region contact via.

12. A method comprising:
facilitating forming a circuit structure, the facilitating forming comprising:
providing a conductive structure comprising a concave contact surface, the concave contact surface being concave from a peripheral region inward towards a center region thereof; and
forming a plurality of contact vias over the concave contact surface of the conductive structure, the plurality of contact vias being smaller than the conductive structure and electrically contacting the concave contact surface of the conductive structure, and the plurality of contact vias comprising at least some differently-sized contact vias, with at least one center region contact via being disposed over the center region of the concave contact surface and at least one peripheral region contact via being disposed over the peripheral region of the concave contact surface, the at least one center region contact via being larger than the at least one peripheral region contact via.

13. The method of claim 12, wherein forming the plurality of contact vias comprises arraying the plurality of contact vias over the concave contact surface of the conductive structure, and wherein the at least one center region contact via is disposed only over the center region of the concave contact surface, and the at least one peripheral region contact via is disposed only over the peripheral region of the concave contact surface.

14. The method of claim 12, wherein the conductive structure comprises a through substrate via (TSV) extending within, at least in part, a substrate of the circuit structure, and the concave contact surface comprises one of an upper surface or a lower surface of the through substrate via.

15. The method of claim 12, wherein the at least one center region contact via is sized with a larger diameter and a larger depth than a diameter and a depth, respectively, of the at least one peripheral region contact via.

16. The method of claim 12, wherein the plurality of contact vias comprise multiple center region contact vias and multiple peripheral region contact vias, the multiple center region contact vias being sized with a larger diameter and a larger depth than the multiple peripheral region contact vias.

17. The method of claim 16, wherein forming the plurality of contact vias further comprises forming multiple intermediate region contact vias disposed over an intermediate region of the concave contact surface of the conductive structure between, at least in part, the center region and the peripheral region thereof the multiple intermediate region contact vias being sized with a smaller diameter and a smaller depth than the multiple center region contact vias, and a larger diameter and a larger depth than the multiple peripheral region contact vias.

18. The method of claim 17, wherein the plurality of contact vias are arrayed in a first metal level trench of the circuit structure over the conductive structure.

19. The method of claim 18, wherein the first metal level trench comprises multiple concentric trench rings of decreasing width outward from a center trench ring to a peripheral trench ring.

20. The method of claim 19, wherein different trench rings of the multiple concentric trench rings each accommodate a different one of the multiple center region contact vias, the multiple intermediate region contact vias, and the multiple peripheral region contact vias.

* * * * *